United States Patent
Britz et al.

(10) Patent No.: US 11,519,066 B2
(45) Date of Patent: Dec. 6, 2022

(54) NITRIDE PROTECTIVE COATINGS ON AEROSPACE COMPONENTS AND METHODS FOR MAKING THE SAME

(71) Applicant: Applied Materials, Inc., Santa Clara, CA (US)

(72) Inventors: David Alexander Britz, San Jose, CA (US); Lance A. Scudder, Sunnyvale, CA (US); Yuriy Melnik, San Jose, CA (US); Sukti Chatterjee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 150 days.

(21) Appl. No.: 16/921,577

(22) Filed: Jul. 6, 2020

(65) Prior Publication Data

US 2021/0363630 A1    Nov. 25, 2021

Related U.S. Application Data

(60) Provisional application No. 63/028,429, filed on May 21, 2020.

(51) Int. Cl.
| | | |
|---|---|---|
| *C23C 16/34* | (2006.01) | |
| *C23C 16/455* | (2006.01) | |
| *C23C 28/04* | (2006.01) | |
| *C23C 16/40* | (2006.01) | |
| *C23C 16/50* | (2006.01) | |

(52) U.S. Cl.
CPC .......... *C23C 16/342* (2013.01); *C23C 16/403* (2013.01); *C23C 16/45536* (2013.01); *C23C 16/50* (2013.01); *C23C 28/042* (2013.01)

(58) Field of Classification Search
None
See application file for complete search history.

(56) References Cited

U.S. PATENT DOCUMENTS

| | | |
|---|---|---|
| 4,698,130 A | 10/1987 | Restall et al. |
| 5,217,757 A | 6/1993 | Olson et al. |
| (Continued) | | |

FOREIGN PATENT DOCUMENTS

| | | |
|---|---|---|
| CN | 104647828 A | 5/2015 |
| EP | 0209307 A1 | 1/1987 |
| (Continued) | | |

OTHER PUBLICATIONS

International Search Report and Written Opinion dated Oct. 30, 2020 for Application No. PCT/US2020/041382.

(Continued)

*Primary Examiner* — Joel G Horning

(74) *Attorney, Agent, or Firm* — Patterson + Sheridan, LLP

(57) ABSTRACT

Embodiments of the present disclosure generally relate to protective coatings on various substrates including aerospace components and methods for depositing the protective coatings. In one or more embodiments, a method of forming a protective coating on an aerospace component includes forming an aluminum oxide layer on a surface of the aerospace component and depositing a boron nitride layer on or over the aluminum oxide layer during a vapor deposition process. In some examples, the method includes depositing a metal-containing catalytic layer on the aluminum oxide layer before depositing the boron nitride layer. The boron nitride layer can include hexagonal boron nitride (hBN).

20 Claims, 2 Drawing Sheets

(56) References Cited

U.S. PATENT DOCUMENTS

| | | |
|---|---|---|
| 5,362,228 A | 11/1994 | Vaudel |
| 5,503,874 A | 4/1996 | Ackerman et al. |
| 5,871,820 A * | 2/1999 | Hasz ............... C04B 35/62222 427/419.7 |
| 5,950,925 A | 9/1999 | Fukunaga et al. |
| 6,042,898 A | 3/2000 | Burns et al. |
| 6,156,382 A | 12/2000 | Rajagopalan et al. |
| 6,162,715 A | 12/2000 | Mak et al. |
| 6,207,295 B1 | 3/2001 | Stowell et al. |
| 6,245,192 B1 | 6/2001 | Dhindsa et al. |
| 6,309,713 B1 | 10/2001 | Mak et al. |
| 6,332,926 B1 | 12/2001 | Pfaendtner et al. |
| 6,359,089 B2 | 3/2002 | Hung et al. |
| 6,379,466 B1 | 4/2002 | Sahin et al. |
| 6,402,898 B1 | 6/2002 | Brumer et al. |
| 6,437,066 B1 | 8/2002 | Hung et al. |
| 6,495,271 B1 | 12/2002 | Vakil |
| 6,551,929 B1 | 4/2003 | Kori et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,244 B1 | 10/2003 | Mao et al. |
| 6,677,247 B2 | 1/2004 | Yuan et al. |
| 6,740,585 B2 | 5/2004 | Yoon et al. |
| 6,784,096 B2 | 8/2004 | Chen et al. |
| 6,797,340 B2 | 9/2004 | Fang et al. |
| 6,805,750 B1 | 10/2004 | Ristau et al. |
| 6,809,026 B2 | 10/2004 | Yoon et al. |
| 6,811,814 B2 | 11/2004 | Chen et al. |
| 6,821,891 B2 | 11/2004 | Chen et al. |
| 6,825,134 B2 | 11/2004 | Law et al. |
| 6,827,978 B2 | 12/2004 | Yoon et al. |
| 6,831,021 B2 | 12/2004 | Chua et al. |
| 6,833,161 B2 | 12/2004 | Wang et al. |
| 6,838,125 B2 | 1/2005 | Chung et al. |
| 6,846,516 B2 | 1/2005 | Yang et al. |
| 6,869,838 B2 | 3/2005 | Law et al. |
| 6,872,429 B1 | 3/2005 | Chen et al. |
| 6,905,939 B2 | 6/2005 | Yuan et al. |
| 6,911,391 B2 | 6/2005 | Yang et al. |
| 6,924,191 B2 | 8/2005 | Liu et al. |
| 6,936,538 B2 | 8/2005 | Byun |
| 6,939,801 B2 | 9/2005 | Chung et al. |
| 6,939,804 B2 | 9/2005 | Lai et al. |
| 6,951,804 B2 | 10/2005 | Seutter et al. |
| 6,972,267 B2 | 12/2005 | Cao et al. |
| 7,026,238 B2 | 4/2006 | Xi et al. |
| 7,041,335 B2 | 5/2006 | Chung |
| 7,049,226 B2 | 5/2006 | Chung et al. |
| 7,081,271 B2 | 7/2006 | Chung et al. |
| 7,101,795 B1 | 9/2006 | Xi et al. |
| 7,211,144 B2 | 5/2007 | Lu et al. |
| 7,211,508 B2 | 5/2007 | Chung et al. |
| 7,241,686 B2 | 7/2007 | Marcadal et al. |
| 7,244,683 B2 | 7/2007 | Chung et al. |
| 7,262,133 B2 | 8/2007 | Chen et al. |
| 7,264,846 B2 | 9/2007 | Chang et al. |
| 7,265,048 B2 | 9/2007 | Chung et al. |
| 7,279,432 B2 | 10/2007 | Xi et al. |
| 7,285,312 B2 | 10/2007 | Li |
| 7,317,229 B2 | 1/2008 | Hung et al. |
| 7,371,467 B2 | 5/2008 | Han et al. |
| 7,396,565 B2 | 7/2008 | Yang et al. |
| 7,404,985 B2 | 7/2008 | Chang et al. |
| 7,405,158 B2 | 7/2008 | Lai et al. |
| 7,416,979 B2 | 8/2008 | Yoon et al. |
| 7,429,402 B2 | 9/2008 | Gandikota et al. |
| 7,429,540 B2 | 9/2008 | Olsen |
| 7,439,191 B2 | 10/2008 | Law et al. |
| 7,473,655 B2 | 1/2009 | Wang et al. |
| 7,507,660 B2 | 3/2009 | Chen et al. |
| 7,531,468 B2 | 5/2009 | Metzner et al. |
| 7,547,952 B2 | 6/2009 | Metzner et al. |
| 7,569,501 B2 | 8/2009 | Metzner et al. |
| 7,573,586 B1 | 8/2009 | Boyer et al. |
| 7,585,762 B2 | 9/2009 | Shah et al. |
| 7,595,263 B2 | 9/2009 | Chung et al. |
| 7,601,652 B2 | 10/2009 | Singh et al. |
| 7,651,955 B2 | 1/2010 | Ranish et al. |
| 7,732,327 B2 | 6/2010 | Lee et al. |
| 7,737,028 B2 | 6/2010 | Wang et al. |
| 7,776,395 B2 | 8/2010 | Mahajani |
| 7,816,200 B2 | 10/2010 | Kher |
| 7,824,743 B2 | 11/2010 | Lee et al. |
| 7,833,358 B2 | 11/2010 | Chu et al. |
| 7,846,840 B2 | 12/2010 | Kori et al. |
| 7,867,900 B2 | 1/2011 | Lee et al. |
| 7,875,119 B2 | 1/2011 | Gartland et al. |
| 7,910,165 B2 | 3/2011 | Ganguli et al. |
| 7,910,231 B2 | 3/2011 | Schuh et al. |
| 7,910,446 B2 | 3/2011 | Ma et al. |
| 7,964,505 B2 | 6/2011 | Khandelwal et al. |
| 7,972,978 B2 | 7/2011 | Mahajani |
| 8,043,907 B2 | 10/2011 | Ma et al. |
| 8,056,652 B2 | 11/2011 | Lockwood et al. |
| 8,227,078 B2 | 7/2012 | Morra et al. |
| 8,277,670 B2 | 10/2012 | Heo et al. |
| 8,470,460 B2 | 6/2013 | Lee |
| 8,721,812 B2 | 5/2014 | Furrer et al. |
| 8,741,420 B2 | 6/2014 | Bunker et al. |
| 8,871,297 B2 | 10/2014 | Barnett et al. |
| 9,255,327 B2 | 2/2016 | Winter et al. |
| 9,347,145 B2 | 5/2016 | Bessho |
| 9,683,281 B2 | 6/2017 | Meehan et al. |
| 9,777,583 B2 | 10/2017 | Leggett |
| 9,873,940 B2 | 1/2018 | Xu et al. |
| 10,072,335 B2 | 9/2018 | Marquardt et al. |
| 10,287,899 B2 | 5/2019 | Dierberger |
| 10,369,593 B2 | 8/2019 | Barnett et al. |
| 10,443,142 B2 | 10/2019 | Miettinen et al. |
| 10,488,332 B2 | 11/2019 | Kessler et al. |
| 10,633,740 B2 | 4/2020 | Melnik et al. |
| 11,028,480 B2 | 6/2021 | Knisley et al. |
| 2002/0002258 A1 | 1/2002 | Hung et al. |
| 2002/0045782 A1 | 4/2002 | Hung et al. |
| 2002/0117399 A1 | 8/2002 | Chen et al. |
| 2002/0127336 A1 | 9/2002 | Chen et al. |
| 2003/0010451 A1 | 1/2003 | Tzu et al. |
| 2003/0057526 A1 | 3/2003 | Chung et al. |
| 2003/0059535 A1 | 3/2003 | Luo et al. |
| 2003/0059538 A1 | 3/2003 | Chung et al. |
| 2003/0072884 A1 | 4/2003 | Zhang et al. |
| 2003/0082301 A1 | 5/2003 | Chen et al. |
| 2003/0123216 A1 | 7/2003 | Yoon et al. |
| 2003/0124262 A1 | 7/2003 | Chen et al. |
| 2003/0132319 A1 | 7/2003 | Hytros et al. |
| 2003/0136520 A1 | 7/2003 | Yudovsky et al. |
| 2003/0139005 A1 | 7/2003 | Song et al. |
| 2003/0145875 A1 | 8/2003 | Han et al. |
| 2003/0157760 A1 | 8/2003 | Xi et al. |
| 2003/0172872 A1 | 9/2003 | Thakur et al. |
| 2003/0198754 A1 | 10/2003 | Xi et al. |
| 2003/0203616 A1 | 10/2003 | Chung et al. |
| 2003/0215570 A1 | 11/2003 | Seutter et al. |
| 2003/0235961 A1 | 12/2003 | Metzner et al. |
| 2004/0009665 A1 | 1/2004 | Chen et al. |
| 2004/0013803 A1 | 1/2004 | Chung et al. |
| 2004/0018738 A1 | 1/2004 | Liu |
| 2004/0079648 A1 | 4/2004 | Khan et al. |
| 2004/0161628 A1 | 8/2004 | Gupta et al. |
| 2004/0171280 A1 | 9/2004 | Conley et al. |
| 2005/0003310 A1 | 1/2005 | Bai et al. |
| 2005/0008780 A1 | 1/2005 | Ackerman et al. |
| 2005/0019593 A1 | 1/2005 | Mancini et al. |
| 2005/0053467 A1 | 3/2005 | Ackerman et al. |
| 2005/0079368 A1 * | 4/2005 | Gorman ............... C25D 5/48 427/446 |
| 2005/0085031 A1 | 4/2005 | Lopatin et al. |
| 2005/0126593 A1 | 6/2005 | Budinger et al. |
| 2005/0158590 A1 | 7/2005 | Li |
| 2005/0255329 A1 | 11/2005 | Hazel |
| 2005/0260347 A1 | 11/2005 | Narwankar et al. |
| 2005/0260357 A1 | 11/2005 | Olsen et al. |

(56) References Cited

U.S. PATENT DOCUMENTS

| | | |
|---|---|---|
| 2005/0271813 A1 | 12/2005 | Kher et al. |
| 2006/0019032 A1 | 1/2006 | Wang et al. |
| 2006/0019033 A1 | 1/2006 | Muthukrishnan et al. |
| 2006/0021633 A1 | 2/2006 | Harvey |
| 2006/0040052 A1 | 2/2006 | Fang et al. |
| 2006/0062917 A1 | 3/2006 | Muthukrishnan et al. |
| 2006/0084283 A1 | 4/2006 | Paranjpe et al. |
| 2006/0148180 A1 | 7/2006 | Ahn et al. |
| 2006/0153995 A1 | 7/2006 | Narwankar et al. |
| 2006/0228895 A1 | 10/2006 | Chae et al. |
| 2006/0246213 A1 | 11/2006 | Moreau et al. |
| 2006/0286819 A1 | 12/2006 | Seutter et al. |
| 2007/0009658 A1 | 1/2007 | Yoo et al. |
| 2007/0009660 A1 | 1/2007 | Sasaki et al. |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0099415 A1 | 5/2007 | Chen et al. |
| 2007/0134518 A1 | 6/2007 | Feist et al. |
| 2007/0202254 A1 | 8/2007 | Ganguli et al. |
| 2007/0259111 A1 | 11/2007 | Singh et al. |
| 2007/0274837 A1 | 11/2007 | Taylor et al. |
| 2008/0032510 A1 | 2/2008 | Olsen |
| 2008/0038578 A1 | 2/2008 | Li |
| 2008/0056905 A1 | 3/2008 | Golecki |
| 2008/0090425 A9 | 4/2008 | Olsen |
| 2008/0113095 A1 | 5/2008 | Gorman et al. |
| 2008/0135914 A1 | 6/2008 | Krishna et al. |
| 2008/0268154 A1 | 10/2008 | Kher et al. |
| 2008/0268635 A1 | 10/2008 | Yu et al. |
| 2009/0004386 A1 | 1/2009 | Makela et al. |
| 2009/0004850 A1 | 1/2009 | Ganguli et al. |
| 2009/0053426 A1 | 2/2009 | Lu et al. |
| 2009/0061613 A1 | 3/2009 | Choi et al. |
| 2009/0098289 A1 | 4/2009 | Deininger et al. |
| 2009/0098346 A1 | 4/2009 | Li |
| 2009/0155976 A1 | 6/2009 | Ahn et al. |
| 2009/0269507 A1 | 10/2009 | Yu et al. |
| 2009/0286400 A1 | 11/2009 | Heo et al. |
| 2010/0062149 A1 | 3/2010 | Ma et al. |
| 2010/0062614 A1 | 3/2010 | Ma et al. |
| 2010/0075499 A1 | 3/2010 | Olsen |
| 2010/0110451 A1 | 5/2010 | Biswas et al. |
| 2010/0120245 A1 | 5/2010 | Tjandra et al. |
| 2010/0159150 A1 | 6/2010 | Kirby et al. |
| 2010/0167527 A1 | 7/2010 | Wu et al. |
| 2010/0239758 A1 | 9/2010 | Kher et al. |
| 2010/0252151 A1 | 10/2010 | Furrer et al. |
| 2010/0270609 A1 | 10/2010 | Olsen et al. |
| 2011/0175038 A1 | 7/2011 | Hou et al. |
| 2011/0293825 A1 | 12/2011 | Atwal et al. |
| 2012/0024403 A1 | 2/2012 | Gage et al. |
| 2012/0040084 A1 | 2/2012 | Fairbourn |
| 2012/0082783 A1 | 4/2012 | Barnett et al. |
| 2012/0148944 A1 | 6/2012 | Oh et al. |
| 2012/0276306 A1 | 11/2012 | Ueda |
| 2012/0318773 A1 | 12/2012 | Wu et al. |
| 2013/0048605 A1 | 2/2013 | Sapre et al. |
| 2013/0140526 A1* | 6/2013 | Kim .................... H01L 29/778 257/29 |
| 2013/0164456 A1 | 6/2013 | Winter et al. |
| 2013/0292655 A1 | 11/2013 | Becker et al. |
| 2014/0103284 A1 | 4/2014 | Hsueh et al. |
| 2014/0264297 A1 | 9/2014 | Kumar et al. |
| 2014/0271220 A1 | 9/2014 | Leggett |
| 2014/0287244 A1* | 9/2014 | Shin .................... C23C 28/34 427/124 |
| 2015/0017324 A1 | 1/2015 | Barnett et al. |
| 2015/0184296 A1 | 7/2015 | Xu et al. |
| 2015/0221541 A1 | 8/2015 | Nemani et al. |
| 2016/0010472 A1 | 1/2016 | Murphy et al. |
| 2016/0060758 A1 | 3/2016 | Marquardt et al. |
| 2016/0181627 A1 | 6/2016 | Roeder et al. |
| 2016/0251972 A1 | 9/2016 | Dierberger |
| 2016/0281230 A1 | 9/2016 | Varadarajan et al. |
| 2016/0298222 A1 | 10/2016 | Meehan et al. |
| 2016/0300709 A1 | 10/2016 | Posseme et al. |
| 2016/0328635 A1 | 11/2016 | Dave et al. |
| 2016/0333493 A1 | 11/2016 | Miettinen et al. |
| 2016/0333494 A1 | 11/2016 | Miettinen et al. |
| 2017/0076968 A1 | 3/2017 | Wang et al. |
| 2017/0084425 A1 | 3/2017 | Uziel et al. |
| 2017/0145836 A1* | 5/2017 | Sivaramakrishnan .... C23C 4/11 |
| 2017/0159198 A1 | 6/2017 | Miettinen et al. |
| 2017/0213570 A1 | 7/2017 | Cheng et al. |
| 2017/0233930 A1 | 8/2017 | Keuleers et al. |
| 2017/0292445 A1 | 10/2017 | Nelson et al. |
| 2017/0314125 A1 | 11/2017 | Fenwick et al. |
| 2018/0006215 A1 | 1/2018 | Jeong et al. |
| 2018/0105932 A1 | 4/2018 | Fenwick et al. |
| 2018/0127868 A1 | 5/2018 | Xu et al. |
| 2018/0156725 A1 | 6/2018 | Kessler et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0271076 A1 | 9/2019 | Fenwick et al. |
| 2019/0274692 A1 | 9/2019 | Lampropoulos et al. |
| 2019/0284686 A1 | 9/2019 | Melnik et al. |
| 2019/0284692 A1 | 9/2019 | Melnik et al. |
| 2019/0284693 A1 | 9/2019 | Task |
| 2019/0284694 A1 | 9/2019 | Knisley et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0382879 A1 | 12/2019 | Jindal et al. |
| 2020/0027767 A1 | 1/2020 | Zang et al. |
| 2020/0043722 A1 | 2/2020 | Cheng et al. |
| 2020/0240018 A1 | 7/2020 | Melnik et al. |
| 2020/0340107 A1 | 10/2020 | Chatterjee et al. |
| 2020/0361124 A1 | 11/2020 | Britz |
| 2020/0392626 A1 | 12/2020 | Chatterjee et al. |
| 2021/0292901 A1 | 9/2021 | Knisley et al. |

FOREIGN PATENT DOCUMENTS

| | | |
|---|---|---|
| EP | 0387113 B1 | 12/1993 |
| EP | 1431372 A2 | 6/2004 |
| EP | 1236812 B1 | 5/2006 |
| EP | 2022868 A2 | 2/2009 |
| EP | 2103707 A1 | 9/2009 |
| EP | 2194164 A1 | 6/2010 |
| EP | 2392895 A1 | 12/2011 |
| EP | 2161352 B1 | 2/2014 |
| EP | 3540092 A1 | 9/2019 |
| JP | 2001342556 A | 12/2001 |
| JP | 2006199988 A | 8/2006 |
| KR | 20060106104 A | 10/2006 |
| KR | 20110014989 A | 2/2011 |
| RU | 2630733 C2 | 9/2017 |
| WO | 9631687 A1 | 10/1996 |
| WO | 00/09778 A1 | 2/2000 |
| WO | 2005059200 A1 | 6/2005 |
| WO | 2014159267 A1 | 10/2014 |
| WO | 2015047783 A1 | 4/2015 |
| WO | 2019182967 A1 | 9/2019 |

OTHER PUBLICATIONS

International Search Report and Written Opinion dated Jul. 2, 2019 for Application No. PCT/US2019/022788.

International Search Report and Written Opinion for International Application No. PCT/US2019/022709 dated Jun. 28, 2019, 13 pages.

(56) References Cited

OTHER PUBLICATIONS

Kaloyeros et al. "Review-Silicon Nitrtide and Silicon Nitride-Rich Thin Film Technologies: Trends in Deposition Technniques and Related Application". ECS Journal of Solid State Science and Technology, 6 (10) p. 691-p. 714 (2017).
"A Review on Alumina-Chrome (Al2O3—Cr2O3) and Chrome-Silica (Cr2O3—SiO2) Refractories along with their Binary Phase Diagrams," Nov. 18, 2009, 6 pages, <http://www.idc-online.com/technical_references/pdfs/chemical_engineering/A_Review_on_Alumina_Chrome.pdf>.
Bensch et al. "Modeling of the Influence of Oxidation of Thin-Walled Specimens of Single Crystal Superalloys," Superalloys 2012: 12th International Symposium on Superalloys, The Minerals, Metals & Materials Society, pp. 331-340, <https://www.tms.org/superalloys/10.7449/2012/Superalloys_2012_331_340.pdf>.
Fujita et al. "Sintering of Al2O3—Cr2O3 Powder Prepared by Sol-Gel Process," Journal of the Society of Materials Science, Japan, vol. 56, No. 6, Jun. 2007, pp. 526-530, <http://www.ecm.okayama-u.ac.jp/ceramics/Research/Papers/2007/Fujita_JSMS56(2007)526.pdf>.
Hirata et al. "Corrosion Resistance of Alumina-Chromia Ceramic Materials against Molten Slag," Materials Transactions, vol. 43, No. 10, 2002, pp. 2561-2567, <https://www.jim.or.jp/journal/e/pdf3/43/10/2561.pdf>.
Knisley et al. "Volatility and High Thermal Stability in Mid to Late First Row Transition Metal Diazadienyl Complexes," Organometallics, 2011, vol. 30, No. 18, pp. 5010-5017.
Pettit et al. "Oxidation and Hot Corrosion of Superalloys," Jan. 1984, The Metal Society AIME, Warrendale, PA, pp. 651-687, <http://www.tms.org/superalloys/10.7449/1984/Superalloys_1984_651_687.pdf>.
Tsai et al. "Growth mechanism of Cr2O3 scales: oxygen and chromium diffusion, oxidation kinetics and effect of yttrium," Materials Science and Engineering A, vol. 212, No. 1, pp. 6-13, 1996, <https://doi.org/10.1016/0921-5093(96)10173-8>.
He et al. "Role of annealing temperatures on the evolution of microstructure and properties of Cr2O3 films," Applied Surface Science, vol. 357, Part B, Dec. 1, 2015, pp. 1472-1480, <https://doi.org/10.1016/j.apsusc.2015.10.023>.
Heidary et al. "Study on the behavior of atomic layer deposition coatings on a nickel substrate at high temperature," Nanotechnology, 27, 245701, 2016, pp. 1-32.
Dyer et al. "CVD Tungsten Carbide and Titanium Carbide Coatings for Aerospace Components," SAE Transactions, vol. 98, Section 1: Journal of Aerospace (1989), pp. 64-70 Abstract Only.
Vargas Garcia et al. "Thermal barrier coatings produced by chemical vapor deposition," Science and Technology of Advanced Materials, vol. 4, No. 4, 2003, pp. 397-402.
International Search Report and Written Opinion dated Jul. 6, 2020 for Application No. PCT/US2020/024285.
PCT Notification of Transmittal of the International Search Report and the Written Opinion of the International Searching Authority for International Application No. PCT/US2019/019113; dated Jun. 10, 2019; 11 total pages.
International Search Report and Written Opinion for International Application No. PCT/US2019/022737 dated Jul. 2, 2019, 11 pages.
Taiwan Office Action dated Apr. 22, 2020 for Application No. 108106406.
PCT International Search Report and the Written Opinion for International Application No. PCT/US2019/041181; dated Oct. 25, 2019; 15 total pages.
International Search Report and Written Opinion dated Jun. 24, 2020 for Application No. PCT/US2020/019151.
Liu et al., "Ultrathin high-temperature oxidation-resistant coatings of hexagonal boron nitride" Nature Communications doi: 10.1038/ncomms3541; Pub. Oct. 4, 2013, 8 pages.
Calderon, "Boron Nitride Growth and Electronics", Cornell University, May 2018.
W. Auwarter, "Hexagonal boron nitride monolayers on metal supports: Versatile templates for atoms, molecules and nanostructures", Surface Science Reports 74 (2019) 1-95.
International Search Report and Written Report dated Jul. 31, 2020 for Application No. PCT/US2020/027247.
International Search Report and the Written Opinion for International Application No. PCT/US2020/028462 dated Jul. 29, 2020, 11 pages.
Leppaniemi, Jarmo, et al., "Corrosion protection of steel with multilayer coatings: Improving the sealing properties of physical vapor deposition CrN coatings with Al2O3/TiO2atomic layer deposition nanolaminates". Thin Solid Films 627 (2017) pp. 59-68.
Ali, Muhammad Rostom, et al., "Electrodeposition of aluminum-chromium alloys from Al&BPC melt and its corrosion and high temperature oxidation behaviors" Electrochimica Acta, vol. 42. No. 15 , pp. 2347-2354, 1997.
Wu, Yanlin, et al., "Atomic Layer Deposition from Dissolved Precursors". Nano Letters 2015, 15, 6379-6385.
Johnson, Andrew L., et al., "Recent developments in molecular precursors for atomic layer deposition". Organomet. Chem., 2019, 42, 1-53.
Haukka, Suvi, et al., "Chemisorption of chromium acetylacetonate on porous high surface area silica". Applied Surface Science, vol. 75, Issues 1-4, Jan. 2, 1994, pp. 220-227. Abstract Only.
Taiwan Office Action dated Dec. 21, 2020 for Application No. 109113600.
International Search Report and Written Opinion dated Feb. 2, 2021 for Application No. PCT/US2020/056618.
Taiwan Office Action dated May 10, 2021 for Application No. 109126499.
European Search Report dated Jul. 26, 2021 for Application No. 19793402.9.
International Search Report and Written Opinion dated Sep. 28, 2021 for Application No. PCT/US2021/035874.
Extended European Search Report dated Oct. 4, 2021 for Application No. 19793402.9.
Partial Supplementary European Search Report dated Feb. 10, 2022 for Application No. 19770951.2.
Taiwan Office Action dated Oct. 7, 2021 for Application No. 109126499.
Extended European Search Report dated Feb. 28, 2022 for Application No. 19771810.9.
International Search Report dated Dec. 1, 2021 for Application No. PCT/US2021/046245.
International Search Report and Written Opinion dated Dec. 2, 2021 for Application No. PCT/US2021/045766.
Liu et al., "Microstructural evolution of the interface between NiCrAlY coating and superalloy during isothermal oxidation", Materials and Design, 80 (2015) pp. 63-69.
Wang et al., "Hydrogen permeation properties of CrxCy@Cr2O3/Al2O3 composite coating derived from selective oxidation of a Cr—C alloy and atomic layer deposition", International Journal of Hydrogen Energy, 43 (2018) pp. 21133-21141.

\* cited by examiner

NITRIDE PROTECTIVE COATINGS ON AEROSPACE COMPONENTS AND METHODS FOR MAKING THE SAME

CROSS-REFERENCE TO RELATED APPLICATIONS

This application claims benefit to U.S. Appl. No. 63/028,429, filed on May 21, 2020, which is herein incorporated by reference.

BACKGROUND

Field

Embodiments of the present disclosure generally relate to deposition processes, and in particular to vapor deposition processes for depositing films on various types of substrates including aerospace components.

Description of the Related Art

Turbine engines typically have components which corrode or degrade over time due to being exposed to hot gases and/or reactive chemicals (e.g., acids, bases, or salts). Such turbine components are often protected by a thermal and/or chemical barrier coating. The current coatings used on airfoils exposed to the hot gases of combustion in gas turbine engines for both environmental protection and as bond coats in thermal barrier coating (TBC) systems include both diffusion aluminides and various metal alloy coatings. These coatings are applied over substrate materials, typically nickel-based superalloys, to provide protection against oxidation and corrosion attack. These coatings are formed on the substrate in a number of different ways. For example, a nickel aluminide layer may be grown as an outer coat on a nickel base superalloy by simply exposing the substrate to an aluminum rich environment at elevated temperatures. The aluminum diffuses into the substrate and combines with the nickel to form an outer surface of the nickel-aluminum alloy.

However, as the increased demands for engine performance elevate the engine operating temperatures and/or the engine life requirements, improvements in the performance of coatings when used as environmental coatings or as bond coatings are needed over and above the capabilities of these existing coatings. Because of these demands, a coating that can be used for environmental protection or as a bond coat capable of withstanding higher operating temperatures or operating for a longer period of time before requiring removal for repair, or both, is desired. These known coating materials and deposition techniques have several shortcomings. Most metal alloy coatings deposited by low pressure plasma spray, plasma vapor deposition (PVD), electron beam PVD (EBPVD), cathodic arc, or similar sputtering techniques are line of sight coatings, meaning that interiors of components are not able to be coated. Platinum electroplating of exteriors typically forms a reasonably uniform coating, however, electroplating the interior of a component has proven to be challenging. The resulting electroplating coatings are often too thin to be protective or too thick that there are other adverse mechanical effects, such as high weight gain or fatigue life debit. Similarly, aluminide coatings suffer from non-uniformity on interior passages of components. Aluminide coatings are brittle, which can lead to reduced life when exposed to fatigue.

In addition, most of these coatings are on the order of greater than 10 micrometers in thickness, which can cause component weight to increase, making design of the disks and other support structures more challenging. Many of these coatings also require high temperature (e.g., greater than 500° C.) steps to deposit or promote enough interdiffusion of the coating into the alloy to achieve adhesion. It is desired by many to have coatings that (1) protect metals from oxidation and corrosion, (2) are capable of high film thickness and composition uniformity on arbitrary geometries, (3) have high adhesion to the metal, (4) are sufficiently thin to not materially increase weight or reduce fatigue life outside of current design practices for bare metal, and/or (5) are deposited at sufficiently low temperature (e.g., 500° C. or less) to not cause microstructural changes to the metal.

Fretting and galling are two major issues that, when combined with the possibility of oxidation and/or hot corrosion, make existing coating technologies unsuitable for mixed mode attack by hot corrosion, oxidation, galling, fretting and/or combinations thereof. Galling is adhesive wear that is caused by microscopic transfer of material between metallic surfaces, during transverse motion, such as sliding. Galling occurs frequently whenever metal surfaces are in contact, sliding against each other, especially with poor lubrication. Fretting refers to wear and sometimes corrosion damage at the asperities of contact surfaces. The contact movement of fretting causes mechanical wear and material transfer at the surface, often followed by oxidation of both the metallic debris and the freshly exposed metallic surfaces. Fretting also includes a mix of rubbing wear, plus corrosive attack.

In a turbine, there is a desire to reduce oxidation and corrosion while also avoiding fretting/galling as a source of initial material removal or cracking that can later cause accelerated corrosion or oxidation, as well as stress-corrosion cracking (SCC), strain-accelerated grain boundary oxidation (SAGBO), and strain-accelerated gamma prime oxidation (SAGPO). One mechanism to reduce fretting is to use a low friction coefficient coating on either a turbine disk attachment for an airfoil, on an airfoil root/dovetail, or both.

Oxide coatings may unintentionally make fretting or galling worse by breaking off and acting as abrasive particles. Similarly, native grown oxide scale may not be adequately lubricious and may similarly break off and act as abrasive particles. Intermetallic coatings like NiAl and Pt-modified NiAl and NiCrAlY bond coats are brittle and thus, if fractured, can unintentionally accelerate fretting and galling wear. Current general practice is to not coat airfoil roots to avoid unintended consequences of the coating making airfoil roots more likely to fail. Sacrificial copper-nickel-indium alloy coatings have been used on turbine hubs for fretting reduction, but these coatings are not designed for oxidation and corrosion protection.

Therefore, improved protective coatings and methods for depositing the protective coatings are needed.

SUMMARY

Embodiments of the present disclosure generally relate to protective coatings on substrates including aerospace components and methods for depositing the protective coatings. In one or more embodiments, a method of forming a protective coating on an aerospace component includes forming an aluminum oxide layer on a surface of the aerospace component and depositing a boron nitride layer over the aluminum oxide layer during a vapor deposition process. The boron nitride layer can be or include hexagonal boron nitride (hBN).

In some embodiments, a method of forming a protective coating on an aerospace component includes forming an aluminum oxide layer on a surface of the aerospace component, depositing a metal-containing catalytic layer on the aluminum oxide layer, and depositing a boron nitride layer on the metal-containing catalytic layer during a vapor deposition process. The aerospace component contains a nickel-containing superalloy. The metal-containing catalytic layer contains one or more metals, such as nickel, chromium, cobalt, molybdenum, tungsten, tantalum, aluminum, titanium, iron, rhenium, ruthenium, hafnium, iridium, platinum, palladium, gold, silver, oxides thereof, alloys thereof, or any combination thereof.

In other embodiments, an aerospace component having a protective coating is provided and includes an aluminum oxide layer disposed on a surface of the aerospace component and a boron nitride layer disposed on or over the aluminum oxide layer, where the aerospace component contains a superalloy having at least nickel and aluminum.

In some embodiments, an aerospace component having a protective coating is provided and includes an aluminum oxide layer disposed on a surface of the aerospace component, a metal-containing catalytic layer disposed on the aluminum oxide layer, and a boron nitride layer disposed on the metal-containing catalytic layer. The metal-containing catalytic layer contains one or more metals, such as nickel, chromium, cobalt, molybdenum, tungsten, tantalum, aluminum, titanium, iron, rhenium, ruthenium, hafnium, iridium, platinum, palladium, gold, silver, oxides thereof, alloys thereof, or any combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to protective coatings, such as an aluminum oxide layer and a boron nitride layer, disposed an aerospace component or other substrate and methods for depositing the protective coatings. The protective coating reduces or prohibits oxidation and/or corrosion of the underlying surface of the aerospace component. The protective coating can also have anti-coking properties by reducing or prohibiting the build-up of coke on the protective coating. The protective coatings can be deposited or otherwise formed on interior surfaces and/or exterior surfaces of the aerospace components or other substrates.

Exemplary aerospace components can be or include one or more of turbine blades, turbine vanes, support members, frames, ribs, fins, pin fins, fuel nozzles, combustor liners, combustor shields, heat exchangers, fuel lines, fuel valves, internal cooling channels, or any combination thereof, or any other aerospace component or part that can benefit from having protective coating deposited thereon. The protective coating can also deposited or otherwise formed on a substrate containing one or more types of metals, a nanostructured device, one or more surfaces or components within a processing chamber, one or more surfaces or components of a tool, or the like. Substrates may contain one or more superalloys, nickel aluminum alloys, nickel alloys, aluminum alloys, and other metal alloys. In one or more examples, the superalloy is a nickel-containing superalloy, such as a superalloy having at least nickel and aluminum.

Figure 1A:
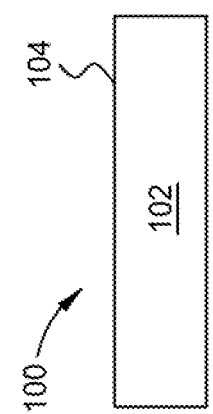
FIGS. 1A-1E are schematic views of protective coatings being formed on a substrate at different stages of fabrication processes, according to one or more embodiments described and discussed herein.
Figure 1B:
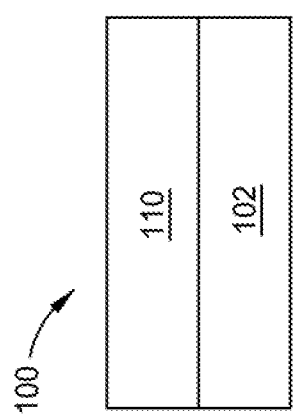
Figure 1C:
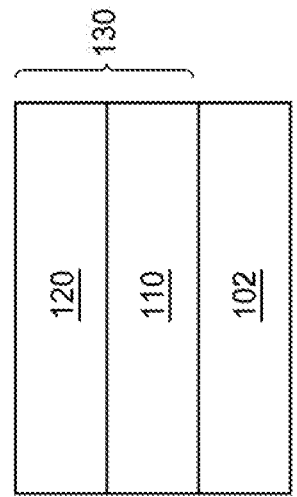
Figure 1D:
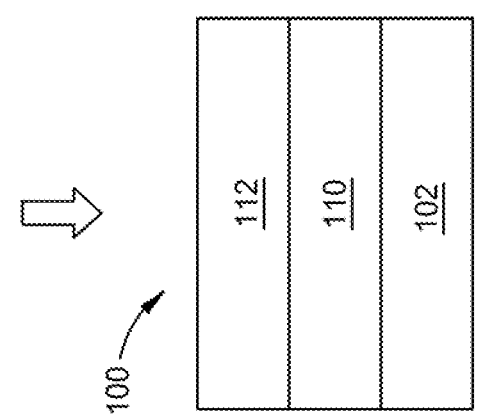
Figure 1E:
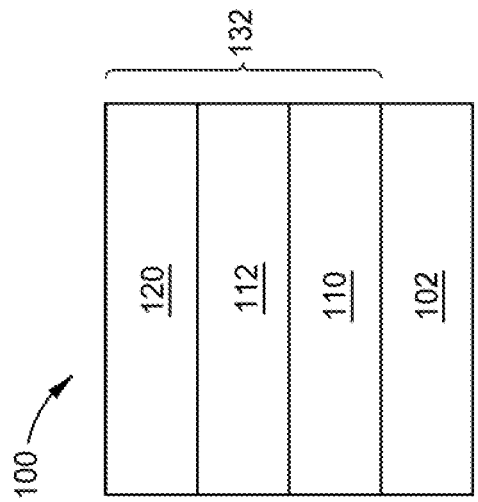

FIGS. 1A-1E are schematic views of a workpiece 100 being processed and illustrate protective coatings 130, 132 being formed on a substrate 102, such as an aerospace component, at different stages of fabrication processes, according to one or more embodiments described and discussed herein. The method includes forming an aluminum oxide layer 110 on a surface 104 of the aerospace component and depositing a boron nitride layer 120 on or over the aluminum oxide layer 110 during a vapor deposition process. In some embodiments, the protective coating 130 contains the aluminum oxide layer 110 and the boron nitride layer 120 disposed thereon, as depicted in FIG. 1C. In other embodiments, prior to depositing the boron nitride layer 120, a metal-containing catalytic layer 112 is formed or deposited on the aluminum oxide layer 110, and thereafter, the boron nitride layer 120 is formed or deposited on the metal-containing catalytic layer 112. As such, the protective coating 132 contains the metal-containing catalytic layer 112 disposed on the aluminum oxide layer 110 and the boron nitride layer 120 disposed on the metal-containing catalytic layer 112, as depicted in FIG. 1E.

Between FIGS. 1A and 1B, the workpiece 100 is shown being further processed and the aluminum oxide layer 110 can be formed or otherwise deposited on the surface 104 of the aerospace component or substrate 102 by one of several processes. In one embodiment, aluminum oxide layer 110 is formed on the surface 104 of the aerospace component or substrate 102 by a thermal process which diffuses aluminum to the surface 104 of the aerospace component or substrate 102 and the aluminum is oxidized to produce aluminum oxide. For example, if the aerospace component or substrate 102 contains a nickel-containing superalloy having aluminum therein, the aluminum oxide layer 110 can be formed by heating the aerospace component or substrate 102 during the thermal process. The thermal process includes heating the aerospace component or substrate 102 to a temperature of about 700° C. to about 1,200° C. for about 1 hour to about 20 hours.

Aluminum atoms diffuse from throughout the nickel-containing superalloy to the surface 104 of the aerospace component or substrate 102. The aluminum atoms form a layer of metallic aluminum which is simultaneously or subsequently oxidized to produce the aluminum oxide layer 110. One or more oxidizing agents can be exposed to the aluminum to form aluminum oxide. Exemplary oxidizing agents can be or include water (e.g., steam), oxygen ($O_2$), atomic oxygen, ozone, nitrous oxide, one or more inorganic peroxides (e.g., hydrogen peroxide or calcium peroxide), one or more organic peroxides, one or more alcohols, plasma thereof, or any combination thereof.

In other embodiments, the aluminum oxide layer 110 is formed on the surface 104 of the aerospace component or substrate 102 by a vapor deposition process. The vapor deposition process can be or include one or more processes selected from atomic layer deposition (ALD), plasma-enhanced ALD (PE-ALD), chemical vapor deposition (CVD), plasma-enhanced CVD (PE-CVD), physical vapor deposition (PVD), combinations thereof, or the like. For example, the aerospace component or substrate 102 may be exposed to an aluminum precursor and an oxidizing agent sequentially during an ALD process or simultaneously during a CVD process.

The aluminum precursor can be or include one or more of aluminum alkyl compounds, one or more of aluminum alkoxy compounds, one or more of aluminum acetylacetonate compounds, substitutes thereof, complexes thereof, abducts thereof, salts thereof, or any combination thereof. Exemplary aluminum precursors can be or include trimethylaluminum, triethylaluminum, tripropylaluminum, tributylaluminum, trimethoxyaluminum, triethoxyaluminum, tripropoxyaluminum, tributoxyaluminum, aluminum acetylacetonate (Al(acac)$_3$, also known as, tris(2,4-pentanediono) aluminum), aluminum hexafluoroacetylacetonate (Al(hfac)$_3$), trisdipivaloylmethanatoaluminum (DPM$_3$Al; ($C_{11}H_{19}O_2$)$_3$Al), isomers thereof, complexes thereof, abducts thereof, salts thereof, or any combination thereof. The oxidizing agent can be or include any one or more of the oxidizing agents described and discussed herein.

The aluminum oxide layer 110 has a thickness of about 1 nm, about 2 nm, about 5 nm, about 10 nm, about 20 nm, about 50 nm, or about 100 nm to about 200 nm, about 300 nm, about 500 nm, about 800 nm, about 1,000 nm, about 1,200 nm, about 1,500 nm, about 2,000 nm, or greater. For example, the aluminum oxide layer 110 has a thickness of about 1 nm to about 1,500 nm, about 2 nm to about 1,000 nm, about 5 nm to about 500 nm, or about 10 nm to about 200 nm.

Between FIGS. 1B and 1C, the workpiece 100 is shown being further processed and the boron nitride layer 120 is deposited or otherwise formed on the aluminum oxide layer 110 to produce the protective coating 130. Between FIGS. 1B, 1D, and 1E, the workpiece 100 is shown being further processed and the metal-containing catalytic layer 112 is deposited or otherwise formed on the aluminum oxide layer 110 (FIGS. 1B and 1D) and the boron nitride layer 120 is deposited or otherwise formed on the metal-containing catalytic layer 112 (FIGS. 1D and 1E) to produce the protective coating 132. The metal-containing catalytic layer 112 helps increase the rate and/or reduce the temperature while depositing the boron nitride layer 120. Specifically, by having the metal-containing catalytic layer 112, a lower process temperature can be used during the deposition of the boron nitride layer 120 and/or the deposition rate of depositing the boron nitride layer 120 is increased as opposed to not having the metal-containing catalytic layer 112 and depositing directly on the aluminum oxide layer 110.

The metal-containing catalytic layer 112 contains one or more metals, one or more metal oxides, or combinations thereof which have catalytic properties for the deposition of the boron nitride layer 120. The metal-containing catalytic layer 112 can be or include nickel, chromium, cobalt, molybdenum, tungsten, tantalum, aluminum, titanium, iron, rhenium, ruthenium, hafnium, iridium, platinum, palladium, gold, silver, oxides thereof, alloys thereof, or any combination thereof. The metal-containing catalytic layer 112 is deposited by one or more deposition processes, such as ALD, PE-ALD, CVD, PE-ALD, PVD, electroless deposition, or combinations thereof. The metal-containing catalytic layer 112 can be deposited or otherwise formed by exposing the workpiece 100 including the aluminum oxide layer 110 to one or more metal precursors which includes the metal desired to be deposited. In one or more examples, the aerospace component or substrate 102 may be exposed to the metal precursor and a reducing agent (e.g., hydrogen ($H_2$), hydrogen plasma, diborane, or ammonia) sequentially during an ALD process or simultaneously during a CVD process to form the metal-containing catalytic layer 112. In other examples, the metal precursor can be thermal decomposed without a reducing agent to produce the metal-containing catalytic layer 112.

In some examples, the aerospace component or substrate 102 includes a nickel-containing superalloy, and each of the metal-containing catalytic layer 112 and the nickel-containing superalloy includes one, two, three, or more of the same metals. For example, the aerospace component or substrate 102 and the metal-containing catalytic layer 112 can both contain chromium, cobalt, and/or iron. In some embodiments, it may be advantageous to match the metal contained in the metal-containing catalytic layer 112 with one or more metals contained in the aerospace component or substrate 102 so that if the metal contained in the metal-containing catalytic layer 112 diffuses into the aerospace component or substrate 102, the same type of metal is already contained within the aerospace component or substrate 102 versus being a different or foreign type of metal which may contaminate the aerospace component or substrate 102.

The metal-containing catalytic layer 112 can be a single layer disposed continuously or discontinuously across the surface of the aluminum oxide layer 110. The metal-containing catalytic layer 112 has a thickness of about 0.1 nm, about 0.2 nm, about 0.3 nm, about 0.4 nm, or about 0.5 nm to about 0.6 nm, about 0.8 nm, about 1 nm, about 1.2 nm, about 1.5 nm, about 1.8 nm, about 2 nm, about 3 nm, or about 5 nm. For example, the metal-containing catalytic layer 112 has a thickness of about 0.1 nm to about 5 nm, about 0.1 nm to about 2 nm, about 0.1 nm to about 1.5 nm, about 0.1 nm to about 1 nm, about 0.1 nm to about 0.5 nm, about 0.3 nm to about 5 nm, about 0.3 nm to about 2 nm, about 0.3 nm to about 1.5 nm, about 0.3 nm to about 1 nm, about 0.3 nm to about 0.5 nm, about 0.5 nm to about 5 nm, about 0.5 nm to about 2 nm, about 0.5 nm to about 1.5 nm, about 0.5 nm to about 1 nm, or about 0.5 nm to about 0.8 nm.

The boron nitride layer 120 may contain any form of boron nitride and mixtures thereof. For example, the boron nitride layer 120 may contain hexagonal boron nitride (hBN). The boron nitride layer 120 is deposited or otherwise formed by one of several deposition processes. The boron nitride layer 120 can be deposited by ALD, PE-ALD, CVD, PE-CVD, or combinations thereof. In some embodiments, one or more boron precursors and one or more nitrogen precursors can be reacted to form the boron nitride layer 120. In other embodiments, a single precursor, such as a boron-nitrogen precursor, containing boron and nitrogen can be used to form the boron nitride layer 120. Exemplary boron precursors can be or include diborane, triborane, tetraborane, decaborane, trimethylborane, triethylborane, trifluoroborane, trichloroborane, adducts thereof, or any combination thereof. Exemplary nitrogen precursors can be or include ammonia, hydrazine, atomic nitrogen, nitrogen plasma, or any combination thereof. Exemplary boron-nitrogen precursors can be or include ammonia borane, borazine, trichloroborazine, adducts thereof, or any combination thereof. Exemplary carrier gases and/or purge gases can independently be or include one or more of nitrogen ($N_2$), argon, helium, neon, hydrogen ($H_2$), or any combination thereof.

The temperature used to deposit the boron nitride layer 120 may depend if the underlying layer is the aluminum oxide layer 110 or the metal-containing catalytic layer 112. Typically, the temperature may be lower if the underlying layer is the metal-containing catalytic layer 112 than if the underlying layer is the aluminum oxide layer 110. In one or more embodiments, the aerospace component or substrate 102 is maintained at a temperature of about 500° C., about 600° C., about 700° C., about 800° C., about 850° C., about 900° C., about 950° C. or about 1,000° C. to about 1,050° C., about 1,200° C., about 1,300° C., about 1,400° C., about 1,450° C., about 1,500° C., or greater while depositing the boron nitride layer 120. For example, the aerospace component or substrate 102 is maintained at a temperature of about 500° C. to about 1,500° C., about 700° C. to about 1,500° C., about 800° C. to about 1,500° C., about 900° C. to about 1,500° C., about 1,000° C. to about 1,500° C., about 1,100° C. to about 1,500° C., about 1,200° C. to about 1,500° C., about 1,300° C. to about 1,500° C., about 700° C. to about 1,200° C., about 800° C. to about 1,200° C., about 900° C. to about 1,200° C., about 1,000° C. to about 1,200° C., or about 1,100° C. to about 1,200° C. while depositing the boron nitride layer 120.

The boron nitride layer 120 has a thickness of about 5 nm, about 10 nm, about 20 nm, about 25 nm, about 50 nm, or about 100 nm to about 120 nm, about 150 nm, about 200 nm, about 250 nm, about 300 nm, about 400 nm, about 500 nm, about 800 nm, or about 1,000 nm. For example, the boron nitride layer 120 has a thickness of about 5 nm to about 500 nm, about 25 nm to about 500 nm, about 50 nm to about 500 nm, about 100 nm to about 500 nm, about 5 nm to about 300 nm, about 25 nm to about 300 nm, about 50 nm to about 300 nm, about 100 nm to about 300 nm, about 5 nm to about 200 nm, about 25 nm to about 200 nm, about 50 nm to about 200 nm, or about 100 nm to about 200 nm.

Deposition Processes

In one or more embodiment, the workpiece 100 including the aerospace component or substrate 102 can be exposed to a first precursor (e.g., aluminum precursor) and a second precursor (e.g., oxidizing agent) to form the aluminum oxide layer 110 on the substrate 102 by a vapor deposition process. In other embodiment, the workpiece 100 including the aerospace component or substrate 102 can be exposed to a first precursor (e.g., boron precursor) and a second precursor (e.g., nitrogen precursor) to form the boron nitride layer 120 on the aluminum oxide layer 110 or the metal-containing catalytic layer 112 by a vapor deposition process. The vapor deposition process can be a thermal ALD process, a PE-ALD process, a thermal CVD process, a PE-CVD process, or any combination thereof.

In one or more embodiments, the vapor deposition process is an ALD process and the method includes sequentially exposing the workpiece 100 including the aerospace component or substrate 102, to the first precursor and the second precursor to form the product layer. Each cycle of the ALD process includes exposing the surface of the workpiece 100 to the first precursor, conducting a pump-purge, exposing the workpiece 100 to the second precursor, and conducting a pump-purge to form the product layer. The order of the first precursor and the second precursor can be reversed, such that the ALD cycle includes exposing the surface of the workpiece 100 to the second precursor, conducting a pump-purge, exposing the workpiece 100 to the first precursor, and conducting a pump-purge to form the product layer.

In some examples, during each ALD cycle, the workpiece 100 is exposed to the first precursor for about 0.1 seconds to about 10 seconds, the second precursor for about 0.1 seconds to about 10 seconds, and the pump-purge for about 0.5 seconds to about 30 seconds. In other examples, during each ALD cycle, the workpiece 100, 200, 300 is exposed to the first precursor for about 0.5 seconds to about 3 seconds, the second precursor for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the product layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the product layer.

In other embodiments, the vapor deposition process is a CVD process and the method includes simultaneously exposing the workpiece 100 to the first precursor and the second precursor to form the product layer. During an ALD process or a CVD process, each of the first precursor and the second precursor can independent include one or more carrier gases. One or more purge gases can be flowed across the surfaces of the workpiece 100 and/or throughout the processing chamber in between the exposures of the first precursor and the second precursor. In some examples, the same gas may be used as a carrier gas and a purge gas. Exemplary carrier gases and/or purge gases can independently be or include one or more of nitrogen ($N_2$), argon, helium, neon, hydrogen ($H_2$), or any combination thereof.

In one or more examples, aluminum oxide layer 110 is formed by an ALD process. The first precursor, trimethylaluminum (at a temperature of about 0° C. to about 30° C.), is delivered to the aerospace component via vapor phase delivery for at pre-determined pulse length of 0.1 seconds. During this process, the processing chamber is operated under a flow of nitrogen carrier gas (100 sccm total) with the processing chamber held at a pre-determined temperature of about 150° C. to about 350° C. and pressure about 1 Torr to about 5 Torr. After the pulse of trimethylaluminum, the processing chamber is then subsequently pumped and purged of all requisite gases and byproducts for a determined amount of time. Subsequently, water vapor, the second precursor, is pulsed into the processing chamber for about 0.1 seconds at chamber pressure of about 3.5 Torr. An additional chamber purge is then performed to rid the processing chamber of any excess reactants and reaction byproducts. This process is repeated as many times as necessary to get the target $Al_2O_3$ film to the desired film thickness. The aerospace component is then subjected to an annealing furnace at a temperature of about 500° C. under inert nitrogen flow of about 500 sccm for about one hour.

Protective Coatings

The protective coating 130, 132 can have an overall thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 800 nm, about 1,000 nm, about 2,000 nm, about 3,000 nm, about 4,000 nm, about 5,000 nm, or thicker. In some examples, the protective coating 130, 132 can have a thickness of less than 10 μm (less than 10,000 nm). For example, the protective coating 130, 132 can have a thickness of about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 80 nm to about 100 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

In one or more embodiments, the protective coating 130, 132 can have a relatively high degree of uniformity. The protective coating 130, 132 can independently have a uniformity from about 0%, about 0.1%, about 0.5%, about 1%, about 2%, about 3%, about 5%, about 8%, or about 10% to about 12%, about 15%, about 18%, about 20%, about 22%, about 25%, about 28%, about 30%, about 35%, about 40%, about 45%, or less than 50% of the thickness. For example, the protective coating 130, 132 can independently have a uniformity from about 0% to about 50%, about 0% to about 40%, about 0% to about 30%, about 0% to less than 30%, about 0% to about 28%, about 0% to about 25%, about 0% to about 20%, about 0% to about 15%, about 0% to about 10%, about 0% to about 8%, about 0% to about 5%, about 0% to about 3%, about 0% to about 2%, about 0% to about 1%, about 0.1% to about 50%, about 0.1% to about 40%, about 0.1% to about 30%, about 0.1% to less than 30%, about 0.1% to about 28%, about 0.1% to about 25%, about 0.1% to about 20%, about 0.1% to about 15%, about 0.1% to about 10%, about 0.1% to about 8%, about 0.1% to about 5%, about 0.1% to about 3%, about 0.1% to about 2%, about 0.1% to about 1%, about 1% to about 50%, about 1% to about 40%, about 1% to about 30%, about 1% to less than 30%, about 1% to about 28%, about 1% to about 25%, about 1% to about 20%, about 1% to about 15%, about 1% to about 10%, about 1% to about 8%, about 1% to about 5%, about 1% to about 3%, about 1% to about 2%, about 5% to about 50%, about 5% to about 40%, about 5% to about 30%, about 5% to less than 30%, about 5% to about 28%, about 5% to about 25%, about 5% to about 20%, about 5% to about 15%, about 5% to about 10%, about 5% to about 8%, about 10% to about 50%, about 10% to about 40%, about 10% to about 30%, about 10% to less than 30%, about 10% to about 28%, about 10% to about 25%, about 10% to about 20%, about 10% to about 15%, or about 10% to about 12% of the thickness.

Figure 2B:
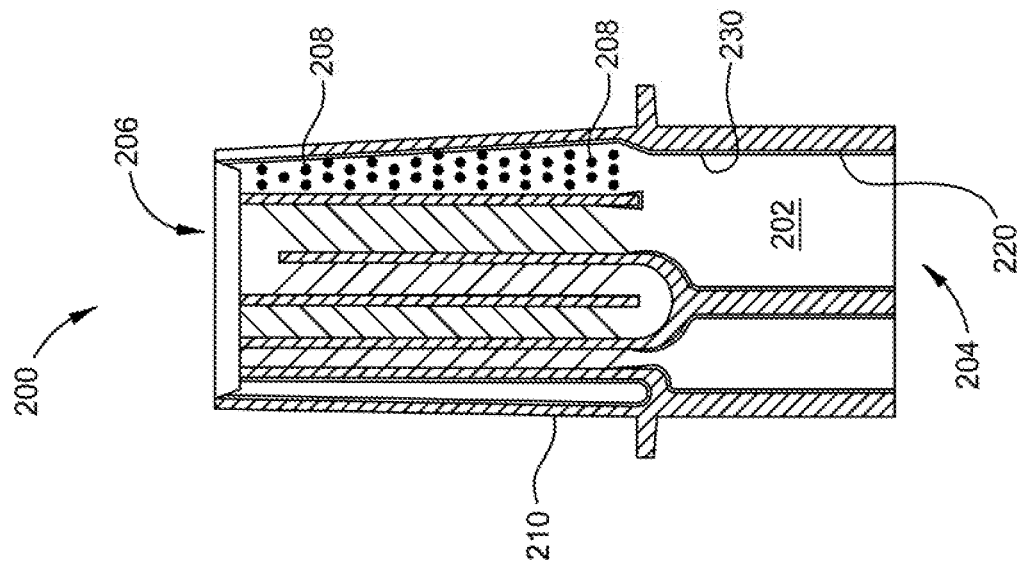
FIGS. 2A and 2B are schematic views of an aerospace component containing one or more protective coatings, according to one or more embodiments described and discussed herein.
Figure 2A:
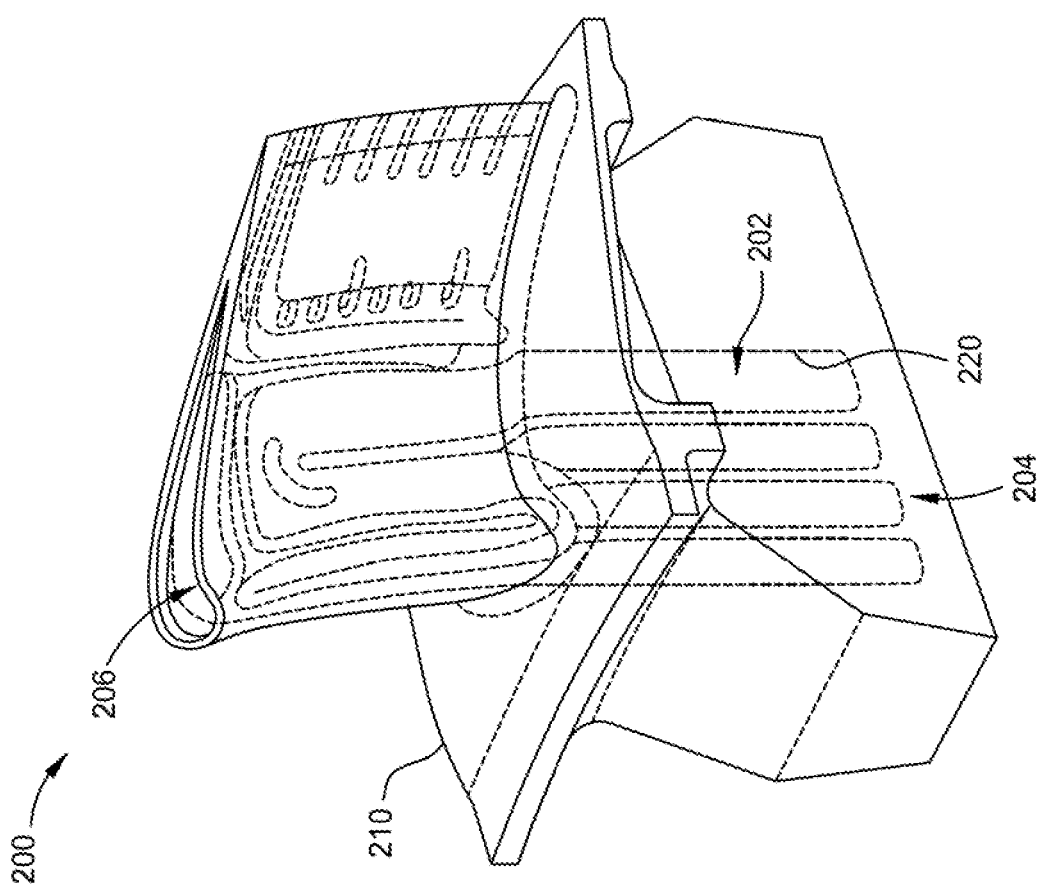

FIGS. 2A and 2B are schematic views of an aerospace component 200 containing a protective coating 230, according to one or more embodiments described and discussed herein. FIG. 2A is a perspective view of the aerospace component 200 and FIG. 2B is a cross-sectional view of the aerospace component 200. The protective coating 230 can be or include the protective coating 130 (FIG. 1C) and/or the protective coating 132 (FIG. 1E). Similarly, the aerospace component 200 can be or include the substrate 102 (FIGS. 1A-1E). Aerospace components as described and discussed herein, including aerospace component 200, can be or include one or more components or portions thereof of a turbine, an aircraft, a spacecraft, or other devices that can include one or more turbines (e.g., compressors, pumps, turbo fans, super chargers, and the like). Exemplary aerospace components 200 can be or include a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof.

The aerospace component 200 has one or more outer or exterior surfaces 210 and one or more inner or interior surfaces 220. The interior surfaces 220 can define one or more cavities 202 extending or contained within the aerospace component 200. The cavities 202 can be channels, passages, spaces, or the like disposed between the interior surfaces 220. The cavity 202 can have one or more openings 204, 206, and 208. Each of the cavities 202 within the aerospace component 200 typically have aspect ratios (e.g., length divided by width) of greater than 1 or greater than 2. The methods described and discussed herein provide depositing and/or otherwise forming the protective coating 230 on the interior surfaces 220 with high aspect ratios (greater than 1) and/or within the cavities 202.

The aspect ratio of the cavity 202 can be from about 2, about 3, about 5, about 8, about 10, or about 12 to about 15, about 20, about 25, about 30, about 40, about 50, about 65, about 80, about 100, about 120, about 150, about 200, about 250, about 300, about 500, about 800, about 1,000, or greater. For example, the aspect ratio of the cavity 202 can be from about 2 to about 1,000, about 2 to about 500, about 2 to about 200, about 2 to about 150, about 2 to about 120, about 2 to about 100, about 2 to about 80, about 2 to about 50, about 2 to about 40, about 2 to about 30, about 2 to about 20, about 2 to about 10, about 2 to about 8, about 5 to about 1,000, about 5 to about 500, about 5 to about 200, about 5 to about 150, about 5 to about 120, about 5 to about 100, about 5 to about 80, about 5 to about 50, about 5 to about 40, about 5 to about 30, about 5 to about 20, about 5 to about 10, about 5 to about 8, about 10 to about 1,000, about 10 to about 500, about 10 to about 200, about 10 to about 150, about 10 to about 120, about 10 to about 100, about 10 to about 80, about 10 to about 50, about 10 to about 40, about 10 to about 30, about 10 to about 20, about 20 to about 1,000, about 20 to about 500, about 20 to about 200, about 20 to about 150, about 20 to about 120, about 20 to about 100, about 20 to about 80, about 20 to about 50, about 20 to about 40, or about 20 to about 30.

The aerospace component 200 and any surface thereof including one or more outer or exterior surfaces 210 and/or one or more inner or interior surfaces 220 can be made of, contain, or otherwise include one or more metals, such as nickel, one or more nickel superalloys, one or more nickel-aluminum alloys, aluminum, iron, one or more stainless steels, cobalt, chromium, molybdenum, titanium, CMSX® superalloys (e.g., CMSX®-2, CMSX®-4, CMSX®-4+, or CMSX®-10 superalloys, commercially from Cannon-Muskegon Corporation), one or more Inconel alloys, one or more Hastelloy alloys, one or more Invar alloys, one or more Inovoco alloys, alloys thereof, or any combination thereof. The protective coating 230 can be deposited, formed, or otherwise produced on any surface of the aerospace component 200 including one or more outer or exterior surfaces 210 and/or one or more inner or interior surfaces 220.

The protective coatings, as described and discussed herein, can be conformal and substantially coat rough surface features following surface topology, including in open pores, blind holes, and non-line-of sight regions of a surface. The protective coatings do not substantially increase surface roughness, and in some embodiments, the protective coatings may reduce surface roughness by conformally coating roughness until it coalesces. The protective coatings may contain particles from the deposition that are substantially larger than the roughness of the aerospace component, but are considered separate from the monolithic film. The protective coatings are substantially well adhered and pinhole free. The thickness of the protective coatings varies within 1-sigma of 40%. In one or more embodiments, the thickness varies less than 1-sigma of 20%, 10%, 5%, 1%, or 0.1%.

The protective coatings provide corrosion and oxidation protection when the aerospace components are exposed to air, oxygen, sulfur and/or sulfur compounds, acids, bases, salts (e.g., Na, K, Mg, Li, or Ca salts), or any combination thereof.

Embodiments of the present disclosure further relate to any one or more of the following paragraphs 1-46:

1. A method of forming a protective coating on an aerospace component, comprising: forming an aluminum oxide layer on a surface of the aerospace component; and depositing a boron nitride layer over the aluminum oxide layer during a vapor deposition process.

2. The method according to paragraph 1, further comprising: depositing a metal-containing catalytic layer on the aluminum oxide layer prior to depositing the boron nitride layer, and then depositing the boron nitride layer on the metal-containing catalytic layer.

3. The method according to paragraph 2, wherein the metal-containing catalytic layer comprises nickel, chromium, cobalt, molybdenum, tungsten, tantalum, aluminum, titanium, iron, rhenium, ruthenium, hafnium, iridium, platinum, palladium, gold, silver, oxides thereof, alloys thereof, or any combination thereof.

4. The method according to paragraph 2, wherein the aerospace component comprises a nickel-containing superalloy, and wherein each of the metal-containing catalytic layer and the nickel-containing superalloy comprises one or more of the same metals.

5. The method according to paragraph 2, wherein the metal-containing catalytic layer has a thickness of about 0.3 nm to about 1.5 nm.

6. The method according to paragraph 2, wherein the metal-containing catalytic layer is deposited by a vapor deposition process selected from atomic layer deposition (ALD), chemical vapor deposition (CVD), physical vapor deposition (PVD), or combinations thereof.

7. The method according to any one of paragraphs 1-6, wherein the boron nitride layer comprises hexagonal boron nitride (hBN).

8. The method according to any one of paragraphs 1-7, wherein the aerospace component is maintained at a temperature of about 800° C. to about 1,500° C. while depositing the boron nitride layer.

9. The method according to any one of paragraphs 1-8, wherein the boron nitride layer has a thickness of about 5 nm to about 500 nm.

10. The method according to any one of paragraphs 1-9, wherein the boron nitride layer has a thickness of about 25 nm to about 200 nm.

11. The method according to any one of paragraphs 1-10, wherein the boron nitride layer is deposited by a vapor deposition process selected from atomic layer deposition (ALD), plasma-enhanced ALD (PE-ALD), chemical vapor deposition (CVD), plasma-enhanced CVD (PE-CVD), or combinations thereof.

12. The method according to any one of paragraphs 1-11, wherein the aluminum oxide layer is formed on the surface of the aerospace component by: heating the aerospace component during a thermal process, wherein the aerospace component comprises a nickel-containing superalloy; diffusing aluminum atoms from the nickel-containing superalloy to the surface of the aerospace component; and oxidizing the aluminum atoms to form the aluminum oxide layer.

13. The method according to paragraph 12, wherein the thermal process comprises heating the aerospace component to a temperature of about 700° C. to about 1,200° C. for about 1 hour to about 20 hours.

14. The method according to any one of paragraphs 1-13, wherein the aluminum oxide layer is formed on the surface of the aerospace component by exposing the aerospace component to an aluminum precursor and an oxidizing agent during a vapor deposition process.

15. The method according to paragraph 14, wherein the vapor deposition process for forming the aluminum oxide layer is an atomic layer deposition (ALD) process or a chemical vapor deposition (CVD) process.

16. The method according to any one of paragraphs 1-15, wherein the aluminum oxide layer has a thickness of about 1 nm to about 1,500 nm.

17. The method according to any one of paragraphs 1-16, wherein the aerospace component is a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof.

18. The method according to any one of paragraphs 1-17, wherein the surface of the aerospace component is an interior surface within a cavity of the aerospace component, and wherein the cavity has an aspect ratio of greater than 2 to about 1,000.

19. A method of forming a protective coating on an aerospace component, comprising: forming an aluminum oxide layer on a surface of the aerospace component, wherein the aerospace component comprises a nickel-containing superalloy; depositing a metal-containing catalytic layer on the aluminum oxide layer, wherein the metal-containing catalytic layer comprises nickel, chromium, cobalt, molybdenum, tungsten, tantalum, aluminum, titanium, iron, rhenium, ruthenium, hafnium, iridium, platinum, palladium, gold, silver, oxides thereof, alloys thereof, or any combination thereof; and depositing a boron nitride layer on the metal-containing catalytic layer during a vapor deposition process.

20. The method according to paragraph 19, wherein the aluminum oxide layer is formed on the surface of the aerospace component by: heating the aerospace component during a thermal process, wherein the aerospace component comprises a nickel-containing superalloy; diffusing aluminum atoms from the nickel-containing superalloy to the surface of the aerospace component; and oxidizing the aluminum atoms to form the aluminum oxide layer.

21. The method according to paragraph 20, wherein the thermal process comprises heating the aerospace component to a temperature of about 700° C. to about 1,200° C. for about 1 hour to about 20 hours.

22. The method according to any one of paragraphs 19-21, wherein the aluminum oxide layer is formed on the surface of the aerospace component by exposing the aerospace component to an aluminum precursor and an oxidizing agent during a vapor deposition process.

23. The method according to paragraph 22, wherein the vapor deposition process for forming the aluminum oxide layer is an atomic layer deposition (ALD) process or a chemical vapor deposition (CVD) process.

24. The method according to any one of paragraphs 19-23, wherein the aluminum oxide layer has a thickness of about 1 nm to about 1,500 nm.

25. The method according to any one of paragraphs 19-24, wherein the metal-containing catalytic layer has a thickness of about 0.3 nm to about 1.5 nm.

26. The method according to any one of paragraphs 19-25, wherein the metal-containing catalytic layer is deposited by a vapor deposition process selected from atomic layer deposition (ALD), chemical vapor deposition (CVD), physical vapor deposition (PVD), or combinations thereof.

27. The method according to any one of paragraphs 19-26, wherein the boron nitride layer comprises hexagonal boron nitride (hBN).

28. The method according to any one of paragraphs 19-27, wherein the boron nitride layer is deposited by a vapor deposition process selected from atomic layer deposition (ALD), plasma-enhanced ALD (PE-ALD), chemical vapor deposition (CVD), plasma-enhanced CVD (PE-CVD), or combinations thereof.

29. The method according to any one of paragraphs 19-28, wherein the aerospace component is maintained at a temperature of about 800° C. to about 1,500° C. while depositing the boron nitride layer.

30. The method according to any one of paragraphs 19-29, wherein the boron nitride layer has a thickness of about 5 nm to about 500 nm.

31. The method according to any one of paragraphs 19-30, wherein the boron nitride layer has a thickness of about 25 nm to about 200 nm.

32. The method according to any one of paragraphs 19-31, wherein the aerospace component comprises a nickel-containing superalloy, and wherein each of the metal-containing catalytic layer and the nickel-containing superalloy comprises one or more of the same metals.

33. The method according to any one of paragraphs 19-32, wherein the aerospace component is a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof.

34. The method according to any one of paragraphs 19-33, wherein the surface of the aerospace component is an interior surface within a cavity of the aerospace component, and wherein the cavity has an aspect ratio of greater than 2 to about 1,000.

35. The method according to any one of paragraphs 19-34, wherein the aluminum oxide layer is formed on the surface of the aerospace component by exposing the aerospace component to an aluminum precursor and an oxidizing agent during a vapor deposition process.

36. The method according to paragraph 35, wherein the vapor deposition process for forming the aluminum oxide layer is an atomic layer deposition (ALD) process or a chemical vapor deposition (CVD) process.

37. An aerospace component prepared by the method according to any one of paragraphs 1-36.

38. An aerospace component having a protective coating, comprising: an aluminum oxide layer disposed on a surface of the aerospace component, wherein the aerospace component comprises a superalloy comprising at least nickel and aluminum; and a boron nitride layer disposed on the aluminum oxide layer.

39. An aerospace component having a protective coating, comprising: an aluminum oxide layer disposed on a surface of the aerospace component, wherein the aerospace component comprises a superalloy comprising at least nickel and aluminum; a metal-containing catalytic layer disposed on the aluminum oxide layer, wherein the metal-containing catalytic layer comprises nickel, chromium, cobalt, molybdenum, tungsten, tantalum, aluminum, titanium, iron, rhenium, ruthenium, hafnium, iridium, platinum, palladium, gold, silver, oxides thereof, alloys thereof, or any combination thereof; and a boron nitride layer disposed on the metal-containing catalytic layer.

40. The aerospace component according to paragraph 39, wherein the aerospace component comprises a nickel-containing superalloy, and wherein each of the metal-containing catalytic layer and the nickel-containing superalloy comprises one or more of the same metals.

41. The aerospace component according to any one of paragraphs 38-40, wherein the metal-containing catalytic layer has a thickness of about 0.3 nm to about 1.5 nm.

42. The aerospace component according to any one of paragraphs 38-41, wherein the boron nitride layer comprises hexagonal boron nitride (hBN).

43. The aerospace component according to any one of paragraphs 38-42, wherein the boron nitride layer has a thickness of about 5 nm to about 500 nm.

44. The aerospace component according to any one of paragraphs 38-43, wherein the aluminum oxide layer has a thickness of about 1 nm to about 1,500 nm.

45. The aerospace component according to any one of paragraphs 38-44, wherein the aerospace component is a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof.

46. The aerospace component according to any one of paragraphs 38-45, wherein the surface of the aerospace component is an interior surface within a cavity of the aerospace component, and wherein the cavity has an aspect ratio of greater than 2 to about 1,000.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of forming a protective coating on an aerospace component, comprising:
   forming an aluminum oxide layer on a surface of the aerospace component;
   depositing a metal-containing catalytic layer on the aluminum oxide layer, wherein the metal-containing catalytic layer has a thickness of about 0.1 nm to about 5 nm; and
   depositing a boron nitride layer over the metal-containing catalytic layer during a vapor deposition process.

2. The method of claim 1, wherein the metal-containing catalytic layer comprises nickel, chromium, cobalt, molybdenum, tungsten, tantalum, aluminum, titanium, iron, rhenium, ruthenium, hafnium, iridium, platinum, palladium, gold, silver, oxides thereof, alloys thereof, or any combination thereof.

3. The method of claim 1, wherein the aerospace component comprises a nickel-containing superalloy, and wherein each of the metal-containing catalytic layer and the nickel-containing superalloy comprises one or more of the same metals.

4. The method of claim 1, wherein the metal-containing catalytic layer has a thickness of about 0.3 nm to about 1.5 nm.

5. The method of claim 1, wherein the metal-containing catalytic layer is deposited by a vapor deposition process selected from atomic layer deposition (ALD), chemical vapor deposition (CVD), physical vapor deposition (PVD), or combinations thereof.

6. The method of claim 1, wherein the boron nitride layer comprises hexagonal boron nitride (hBN).

7. The method of claim 1, wherein the boron nitride layer has a thickness of about 5 nm to about 500 nm.

8. The method of claim 1, wherein the aerospace component is maintained at a temperature of about 800° C. to about 1,500° C. while depositing the boron nitride layer, and wherein the boron nitride layer is deposited by a vapor deposition process selected from atomic layer deposition (ALD), plasma-enhanced ALD (PE-ALD), chemical vapor deposition (CVD), plasma-enhanced CVD (PE-CVD), or combinations thereof.

9. The method of claim 1, wherein the aluminum oxide layer is formed on the surface of the aerospace component by:
   heating the aerospace component during a thermal process, wherein the aerospace component comprises a nickel-containing superalloy;
   diffusing aluminum atoms from the nickel-containing superalloy to the surface of the aerospace component; and
   oxidizing the aluminum atoms to form the aluminum oxide layer.

10. The method of claim 9, wherein the thermal process comprises heating the aerospace component to a temperature of about 700° C. to about 1,200° C. for about 1 hour to about 20 hours.

11. The method of claim 1, wherein the aluminum oxide layer is formed on the surface of the aerospace component by exposing the aerospace component to an aluminum precursor and an oxidizing agent during an atomic layer deposition (ALD) process or a chemical vapor deposition (CVD) process.

12. The method of claim 1, wherein the aluminum oxide layer has a thickness of about 1 nm to about 1,500 nm.

13. The method of claim 1, wherein the aerospace component is a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof.

14. The method of claim 1, wherein the surface of the aerospace component is an interior surface within a cavity of the aerospace component, and wherein the cavity has an aspect ratio of greater than 2 to about 1,000.

15. A method of forming a protective coating on an aerospace component, comprising:
   forming an aluminum oxide layer on a surface of the aerospace component, wherein the aerospace component comprises a nickel-containing superalloy;
   depositing a metal-containing catalytic layer on the aluminum oxide layer, wherein the metal-containing catalytic layer comprises nickel, chromium, cobalt, molybdenum, tungsten, tantalum, aluminum, titanium, iron, rhenium, ruthenium, hafnium, iridium, platinum, palladium, gold, silver, oxides thereof, alloys thereof, or any combination thereof, and wherein the metal-containing catalytic layer has a thickness of about 0.1 nm to about 5 nm; and
   depositing a boron nitride layer on the metal-containing catalytic layer during a vapor deposition process.

16. The method of claim 15, wherein the aluminum oxide layer is formed on the surface of the aerospace component by:
   heating the aerospace component to a temperature of about 700° C. to about 1,200° C. for about 1 hour to about 20 hours during a thermal process, wherein the aerospace component comprises a nickel-containing superalloy;

diffusing aluminum atoms from the nickel-containing superalloy to the surface of the aerospace component; and oxidizing the aluminum atoms to form the aluminum oxide layer.

17. The method of claim 15, wherein the aluminum oxide layer is formed on the surface of the aerospace component by exposing the aerospace component to an aluminum precursor and an oxidizing agent during an atomic layer deposition (ALD) process or a chemical vapor deposition (CVD) process.

18. The method of claim 15, wherein the aluminum oxide layer has a thickness of about 1 nm to about 1,500 nm.

19. The method of claim 15, wherein the metal-containing catalytic layer has a thickness of about 0.3 nm to about 1.5 nm.

20. A method of forming a protective coating on an aerospace component, comprising:

forming an aluminum oxide layer on a surface of the aerospace component, wherein the aerospace component is a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof;

depositing a metal-containing catalytic layer over the aluminum oxide layer, wherein the metal-containing catalytic layer has a thickness of about 0.1 nm to about 5 nm; and depositing a boron nitride layer over the metal-containing catalytic layer during an atomic layer deposition (ALD) process or a chemical vapor deposition (CVD) process.

* * * * *